US008921944B2

(12) United States Patent
Wu et al.

(10) Patent No.: US 8,921,944 B2
(45) Date of Patent: Dec. 30, 2014

(54) SEMICONDUCTOR DEVICE

(75) Inventors: Chun-Yuan Wu, Yun-Lin County (TW); Chih-Chien Liu, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/185,517

(22) Filed: Jul. 19, 2011

(65) Prior Publication Data
US 2013/0020648 A1 Jan. 24, 2013

(51) Int. Cl.
*H01L 29/78* (2006.01)
*H01L 21/8234* (2006.01)
*H01L 27/088* (2006.01)
*H01L 21/768* (2006.01)
*H01L 21/762* (2006.01)

(52) U.S. Cl.
CPC ... *H01L 21/823412* (2013.01); *H01L 21/823475* (2013.01); *H01L 21/823481* (2013.01); *H01L 29/7846* (2013.01); *H01L 27/088* (2013.01); *H01L 21/76801* (2013.01); *H01L 21/76224* (2013.01); *H01L 21/823418* (2013.01); *H01L 29/7843* (2013.01)
USPC ........... 257/368; 257/369; 257/382; 257/401; 438/586; 438/154; 438/233

(58) Field of Classification Search
USPC .......................................... 257/192, 506, 510
See application file for complete search history.

(56) References Cited

U.S. PATENT DOCUMENTS

| 5,447,884 | A | 9/1995 | Fahey |
| 6,245,626 | B1 | 6/2001 | Chen |
| 6,455,912 | B1 * | 9/2002 | Kim et al. ............ 257/506 |
| 6,652,718 | B1 | 11/2003 | D'Couto |
| 6,764,908 | B1 * | 7/2004 | Kadosh et al. ............ 438/285 |
| 7,118,987 | B2 | 10/2006 | Fu |
| 7,119,404 | B2 | 10/2006 | Chang |
| 7,138,323 | B2 | 11/2006 | Kavalieros |
| 7,271,464 | B2 | 9/2007 | Trivedi |
| 7,314,793 | B2 | 1/2008 | Frohberg |
| 7,396,728 | B2 | 7/2008 | Varghese |
| 7,456,067 | B2 | 11/2008 | Ang |
| 7,482,245 | B1 | 1/2009 | Yu |
| 7,517,816 | B2 | 4/2009 | Frohberg |
| 7,932,542 | B2 * | 4/2011 | Berthold et al. ............ 257/202 |
| 2002/0135071 | A1 | 9/2002 | Kang |
| 2004/0075148 | A1 * | 4/2004 | Kumagai et al. ............ 257/369 |
| 2004/0142537 | A1 * | 7/2004 | Lee et al. ............ 438/424 |
| 2005/0266639 | A1 * | 12/2005 | Frohberg et al. ............ 438/257 |
| 2006/0001095 | A1 | 1/2006 | Doris |
| 2006/0197161 | A1 | 9/2006 | Takao |
| 2006/0281245 | A1 | 12/2006 | Okuno |
| 2007/0057324 | A1 * | 3/2007 | Tews et al. ............ 257/347 |
| 2007/0141852 | A1 | 6/2007 | Stapelmann |
| 2008/0142897 | A1 * | 6/2008 | Teh et al. ............ 257/369 |
| 2008/0173947 | A1 | 7/2008 | Hou |
| 2008/0242020 | A1 | 10/2008 | Chen |
| 2009/0057777 | A1 * | 3/2009 | Fujii et al. ............ 257/374 |
| 2009/0137089 | A1 * | 5/2009 | Ting et al. ............ 438/218 |

(Continued)

*Primary Examiner* — Julio J Maldonado
*Assistant Examiner* — Jaehwan Oh
(74) *Attorney, Agent, or Firm* — Winston Hsu; Scott Margo

(57) ABSTRACT

A semiconductor device is disclosed. The semiconductor device includes: a substrate; a metal-oxide semiconductor (MOS) transistor disposed in the substrate; and a shallow trench isolation (STI) disposed in the substrate and around the MOS transistor, in which the STI comprises a stress material.

21 Claims, 3 Drawing Sheets

(56) References Cited

U.S. PATENT DOCUMENTS

| | | |
|---|---|---|
| 2009/0159981 A1 | 6/2009 | Niimi |
| 2009/0230439 A1 | 9/2009 | Wang |
| 2009/0278150 A1* | 11/2009 | Lee et al. .................. 257/98 |
| 2009/0282374 A1* | 11/2009 | Lu et al. ..................... 716/2 |
| 2009/0289284 A1 | 11/2009 | Goh |
| 2009/0298248 A1* | 12/2009 | Fung ........................ 438/296 |
| 2010/0133621 A1* | 6/2010 | Frohberg et al. ........... 257/368 |
| 2010/0184359 A1 | 7/2010 | Park |
| 2011/0027965 A1* | 2/2011 | Tamura ..................... 438/435 |
| 2011/0278680 A1* | 11/2011 | Tews et al. ................ 257/392 |
| 2012/0032275 A1* | 2/2012 | Haran et al. .............. 257/401 |
| 2012/0068273 A1* | 3/2012 | Fischer et al. ............. 257/369 |
| 2012/0139062 A1* | 6/2012 | Yuan et al. ................ 257/411 |
| 2012/0168881 A1* | 7/2012 | Yin et al. .................. 257/411 |
| 2013/0020648 A1* | 1/2013 | Wu et al. ................... 257/368 |

* cited by examiner

SEMICONDUCTOR DEVICE

BACKGROUND OF THE INVENTION

1. Field of the Invention

The invention relates to a semiconductor device, and more particularly, to a semiconductor device with stress-induced STI or contact plugs.

2. Description of the Prior Art

A conventional MOS transistor generally includes a semiconductor substrate, such as silicon, a source region, a drain region, a channel positioned between the source region and the drain region, and a gate located above the channel. The gate is composed of a gate dielectric layer, a gate conductive layer positioned on the gate dielectric layer, and a plurality of spacers positioned on the sidewalls of the gate conductive layer. Generally, for a given electric field across the channel of a MOS transistor, the amount of current that flows through the channel is directly proportional to a mobility of the carriers in the channel. Therefore, how to improve the carrier mobility so as to increase the speed performance of MOS transistors has become a major topic for study in the semiconductor field.

The formation of SiGe source/drain regions is commonly achieved by epitaxially growing a SiGe layer adjacent to the spacers within the semiconductor substrate after forming the spacer. In this type of MOS transistor, a biaxial tensile strain occurs in the epitaxial silicon layer due to the silicon germanium, which has a larger lattice constant than silicon, and, as a result, the band structure alters, and the carrier mobility increases. This enhances the speed performance of the MOS transistor.

In addition to the application of epitaxial layer, as the semiconductor processes advance, how to increase the driving current for metal oxide semiconductor (MOS) transistors for fabrication processes under 65 nanometer has become an important topic. According to this trend, the utilization of high stress films for increasing the driving current of MOS transistors has become increasingly popular. Currently, the utilization of high stress films to increase the driving current of MOS transistors is divided into two categories: one being a poly stressor formed before the formation of nickel silicides and the other being a contact etch stop layer (CESL) formed after the formation of the nickel silicides.

However, as current approach of either using epitaxial layer or stress films to increase the mobility of carrier in the channel regions of transistor has reached a bottleneck, how to further improve the performance of current device has become an important task.

SUMMARY OF THE INVENTION

It is an objective of the present invention to provide a semiconductor device, which preferably increases the mobility of carriers in the channel region of the MOS transistor through utilization of stress-induced STI structures and contact plugs.

A semiconductor device is disclosed. The semiconductor device includes: a substrate; a metal-oxide semiconductor (MOS) transistor disposed in the substrate; and a shallow trench isolation (STI) disposed in the substrate and around the MOS transistor, in which the STI comprises a stress material.

Another aspect of the present invention provides a semiconductor device, which includes: a substrate; a metal-oxide semiconductor (MOS) transistor disposed in the substrate; a dielectric layer disposed on the substrate to cover the MOS transistor; and at least one stress plug disposed in the dielectric layer and around the MOS transistor, wherein the stress plug comprises a stress material.

Another aspect of the present invention provides a method for fabricating semiconductor device. The method includes the steps of: providing a substrate; forming a metal-oxide semiconductor (MOS) transistor in the substrate; forming a dielectric layer on the substrate to cover the MOS transistor; forming at least a contact hole in the dielectric layer and around the MOS transistor; and filling the contact hole with a stress material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
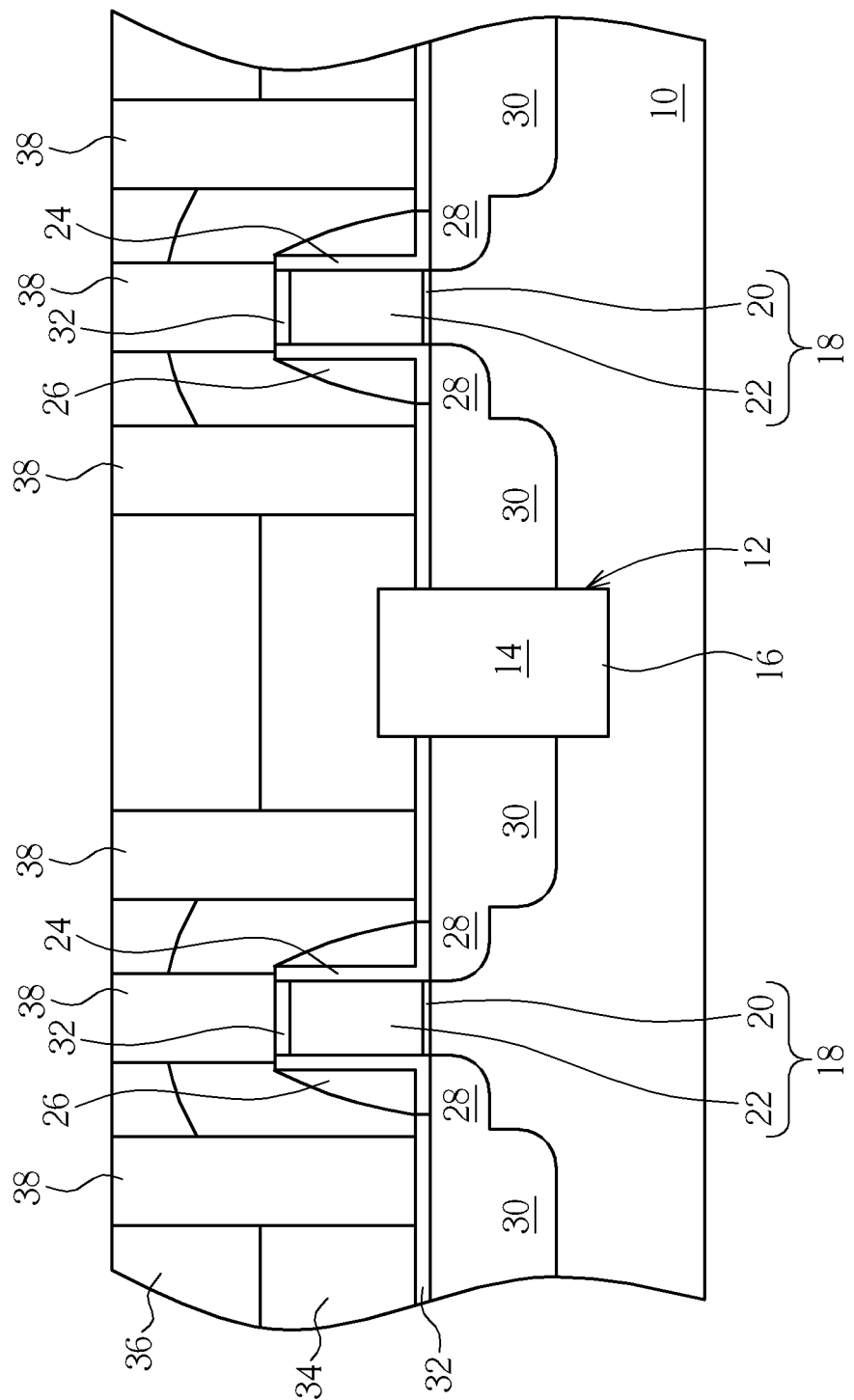
FIG. 1 illustrates a perspective view of a semiconductor device according to a preferred embodiment of the present invention.

Referring to FIG. 1, FIG. 1 illustrates a perspective view of a semiconductor device according to a preferred embodiment of the present invention. As shown in FIG. 1, a substrate 10, such as a silicon substrate or a silicon-on-insulator (SOI) substrate is provided. A shallow trench isolation (STI) fabrication is then performed by first using one or more photo-etching process to form a trench 12 dividing or surrounding each active region, and forming a stress material 14 on the surface of the substrate 10 to fill the trench 12. A planarizing process, such as a chemical mechanical polishing (CMP) process is then performed to partially remove the stress material 14 on the surface of the substrate 10 so that the surface of the stress material 14 in the trench 12 is even with the surface of the substrate 10. As a result, a STI 16 structure filled with stress material 14 is formed.

According to a preferred embodiment of the present invention, the stress material 14 is selected from a material consisting of silicon nitride, boron nitride, silicon oxide, silicon carbide, and silicon oxynitride, in which the stress material 14 filled into the STI 16 could be a single material layer or multiple layers composed of same or different material, which are all within the scope of the present invention. Preferably, the stress of silicon nitride is between −3.5 GPa to 2.0 GPa and the stress of boron nitride is between −1 GPa to −2 GPa. As boron nitride is stable in air, vacuum, and inert gases and also being a suitable insulator with pronounced heat dissipating ability, the trench 12 is preferably filled with stress material such as boron nitride.

A MOS transistor fabrication is then carried out by first forming a gate structure 18 in the substrate 10 adjacent to two sides of the STI 16 shown in FIG. 1. The gate structure 18 could include a gate dielectric layer 20 and a gate electrode 22. An offset spacer 24 and a main spacer 26 are formed on the sidewall of each gate structure 18, and a lightly doped drain 28 and source/drain 30 with corresponding conductive type are formed in the substrate 10 adjacent to two sides of the offset spacer 24 and main spacer 26.

Next, a selective epitaxial growth process is performed to form an epitaxial layer (not shown) in the substrate 10 adjacent to two sides of the main spacer 26, in which the material of the epitaxial layer could be selected according to the nature of the transistor being fabricated. For instance, if the transistor being fabricated is a NMOS transistor, the epitaxial layer preferably includes SiC; if the transistor being fabricating is a PMOS transistor, the epitaxial layer preferably includes SiGe.

Next, a salicide process is performed by first forming a metal selected from a group consisting of cobalt, titanium, nickel, platinum, palladium, and molybdenum on the substrate 10 to cover the source/drain 30 and epitaxial layer, and then using at least one rapid thermal anneal process to react the metal with source/drain 30 and epitaxial layer for forming a silicide layer 32 in the substrate 10 adjacent to two sides of the main spacer 26. The un-reacted metal is removed thereafter.

Next, a stress layer 34 is covered on the surface of the substrate 10 and gate structure 18, in which the material of the stress layer 34 could be adjusted according to the conductivity of the transistor. For instance, if the transistor being fabricated is a NMOS transistor, the stress layer is a tensile stress layer; if the transistor being fabricated is a PMOS transistor, the stress layer is a compressive stress layer.

Next, an interlayer dielectric layer 36 is formed on the substrate 10 to cover the stress layer 34, and a plurality of contact holes are formed in the interlayer dielectric layer 36 and the stress layer 34. After the contact hole is filled with metal such as tungsten, a plurality of contact plugs 38 connecting the source/drain 30 is formed. This completes the fabrication of a semiconductor device according to a preferred embodiment of the present invention.

In this embodiment, the MOS transistors formed adjacent to two sides of the STI are preferably transistors of same conductive type, such as all NMOS transistors or all PMOS transistors. By doing so, the stress material 14 filled into the STI 16 could be utilized to provide a tensile strain for NMOS transistors disposed on two sides of the STI 16 or to provide a compressive strain for PMOS transistors disposed on two sides of the STI 16.

Figure 2:
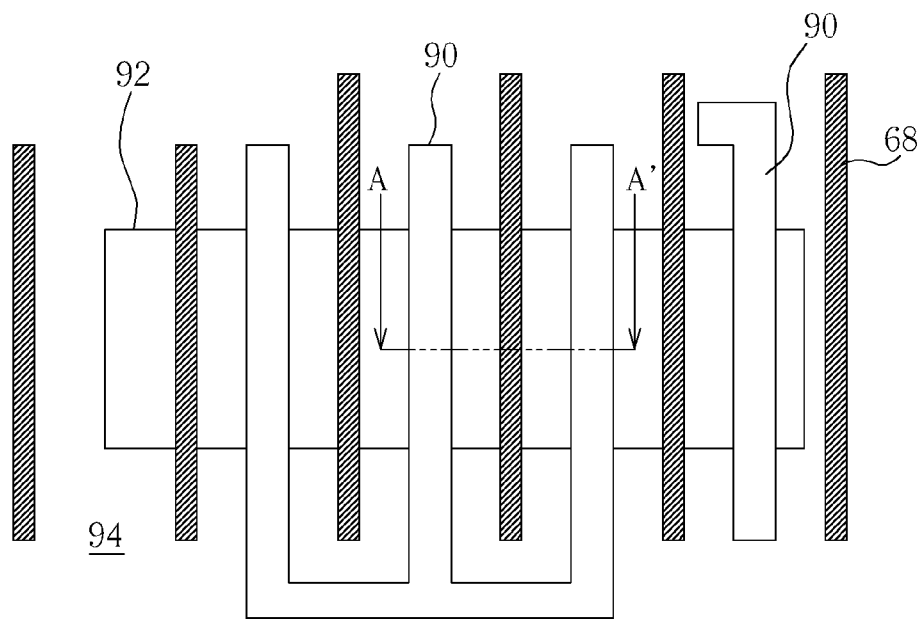
FIG. 2 illustrates a top view of a semiconductor device according to another embodiment of the present invention.
Figure 3:
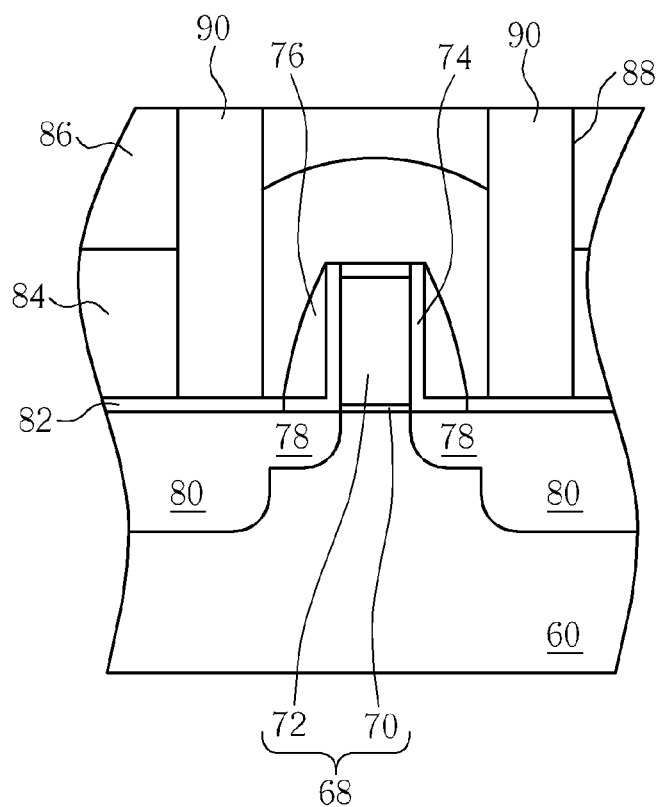
FIG. 3 illustrates a cross-sectional view of FIG. 2 along the sectional line AA'.

Referring to FIGS. 2-3, FIG. 2 illustrates a top view of a semiconductor device according to another embodiment of the present invention and FIG. 3 illustrates a cross-sectional view of FIG. 2 along the sectional line AA'. As shown in the figures, a substrate 60, such as silicon substrate or a SOI substrate is provided. At least an active region 92 is defined on the substrate 60 and a plurality of STIs 94 are disposed around the active region 92, in which the STIs 94 could be the STI structure having stress as disclosed in FIG. 1.

Next, at least a gate structure 68 is formed on the substrate 60, in which the gate structure 68 includes a gate dielectric layer 70 and a gate electrode 72. An offset spacer 74 and a main spacer 76 are formed on the sidewall of each gate structure 68, and a lightly doped drain 78 and source/drain 70 with corresponding conductive type are formed in the substrate 60 adjacent to two sides of the offset spacer 74 and main spacer 76.

Next, a selective epitaxial growth process is performed to form an epitaxial layer (not shown) in the substrate 60 adjacent to two sides of the main spacer 76, in which the material of the epitaxial layer could be selected according to the nature of the transistor being fabricated. For instance, if the transistor being fabricated is a NMOS transistor, the epitaxial layer preferably includes SiC; if the transistor being fabricating is a PMOS transistor, the epitaxial layer preferably includes SiGe.

Next, a salicide process is performed by first forming a metal selected from a group consisting of cobalt, titanium, nickel, platinum, palladium, and molybdenum on the substrate 60 to cover the source/drain 80 and epitaxial layer, and then using at least one rapid thermal anneal process to react the metal with source/drain 80 and epitaxial layer for forming a silicide layer 82 in the substrate 60 adjacent to two sides of the main spacer 86. The un-reacted metal is removed thereafter.

Next, a stress layer 84 is selectively covered on the surface of the substrate 60 and gate structure 68, in which the material of the stress layer 84 could be adjusted according to the conductivity of the transistor. For instance, if the transistor being fabricated is a NMOS transistor, the stress layer is a tensile stress layer; if the transistor being fabricated is a PMOS transistor, the stress layer is a compressive stress layer.

Next, an interlayer dielectric layer 86 is formed on the substrate 60 to cover the stress layer 84, and one ore more etching process is conducted to form a plurality of contact holes 88 in the interlayer dielectric layer 86 and the stress layer 84. After filling the contact holes 88 with a stress material, a plurality of stress plugs 90 is formed in the contact holes 88. In contrast to typical contact plugs contacting the source/drain 80, the stress plugs 90 of this embodiment are situated around the entire MOS transistor while not electrically connected to the source/drain 80. As the stress plugs 90 are primarily used to provide stress to the channel region of the MOS transistor, the stress plugs 90 are extended parallel to the gate structures 68, such as parallel to the width of the channel. Moreover, the MOS transistors adjacent to two sides of the stress plugs 90 are preferably transistors of the same conductive type, such as both being NMOS transistors or PMOS transistors. By following this design, the stress plugs 90 could provide a tensile stress to two adjacent NMOS transistors simultaneously or provide a compressive stress to adjacent PMOS transistors simultaneously.

According to a preferred embodiment of the present invention, the stress material filled into the contact hole 88 is selected from a material consisting of silicon nitride, boron nitride, silicon oxide, silicon carbide, and silicon oxynitride. In addition, the stress of silicon nitride is between −3.5 GPa to 2.0 GPa and the stress of boron nitride is between −1 GPa to −2 GPa. As boron nitride is stable in air, vacuum, and inert gases and also being a suitable insulator with pronounced heat dissipating ability, the contact holes 88 are preferably filled with stress material such as boron nitride.

Figure 4:
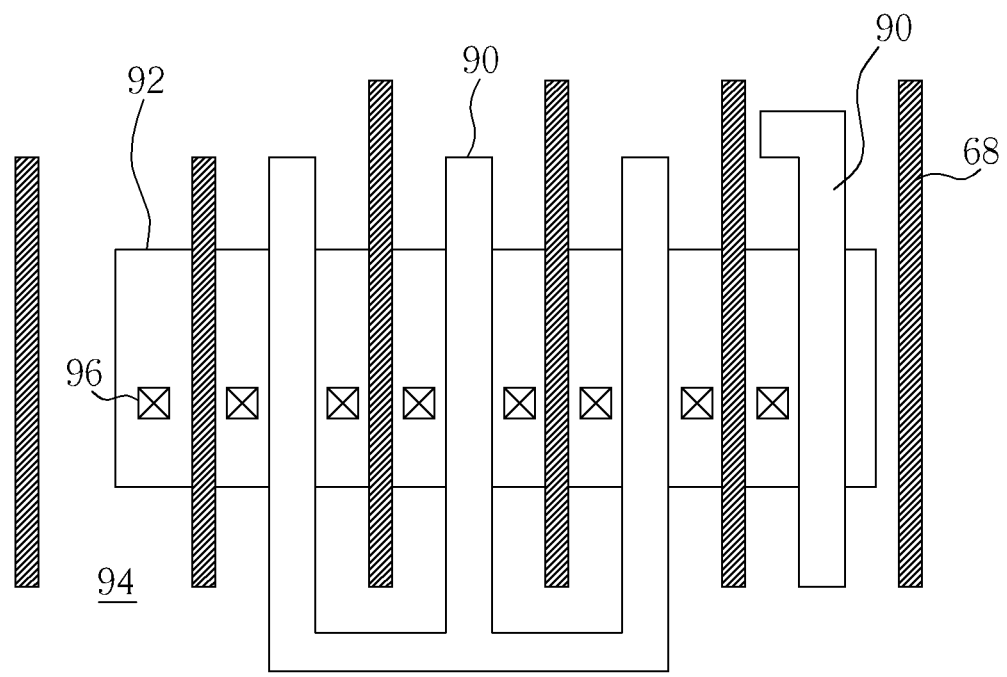
FIG. 4 illustrates a top view of a semiconductor device having both contact plugs and stress plugs.

One or more etching processes are then conducted to form a plurality of contact holes (not shown) in the interlayer dielectric layer 86 and stress layer 84, and a conductive material is provided to fill the contact holes for forming a plurality of conductive plugs (not shown) in the contact holes. It should be noted that these conductive plugs could be disposed anywhere in the active region 92 for electrically connecting the source/drain 80. For instance, these conductive plugs could be disposed between the gate structures 68 and the stress plugs 90, or the stress plugs 90 could be disposed between the gate structures 68 and the conductive plugs, or even the conductive plugs be formed in the stress plugs 90 and penetrating the stress plug 90 to electrically connect to the source/drain 80. Referring now to FIG. 4, which illustrates a top view of a semiconductor device having both contact plugs and stress plugs. As shown in FIG. 4, a plurality of contact plugs 96 could be disposed between the stress plugs 90 and the gate structure 68. It should be noted that the position of the contact plugs 96 is not limited to the ones shown in the figure, but could also be placed anywhere in the active region 92, such as adjacent to the ends of the stress plugs 90, which are all within the scope of the present invention.

Overall, the present invention preferably fills the STI in the substrate and contact holes in the interlayer dielectric layer with stress material to form STI structures and contact plugs with capable of applying stress. By doing so, the present invention could improve the carrier mobility in the channel region of the entire MOS transistor on top of epitaxial layer and stress layer. Also, the aforementioned approach for forming STI and contact plugs with stress material could also be applied to other fabrication and devices, such as memory devices or high voltage devices. Moreover, the transistor of the present invention could include transistors with polysilicon gate or metal gate, in which the metal gate transistors could be fabricated from gate first, gate last, high-k first, or high-k last processes.

Those skilled in the art will readily observe that numerous modifications and alterations of the device and method may be made while retaining the teachings of the invention.

What is claimed is:

1. A semiconductor device, comprising:
    a substrate;
    at least two metal-oxide semiconductor (MOS) transistors disposed in the substrate, wherein the MOS transistor comprises a gate structure and a source/drain disposed in the substrate adjacent to two sides of the gate structure;
    at least one stress plug disposed between two MOS transistors, and the stress plug is not electrically connected to the source/drain;
    a shallow trench isolation (STI) disposed in the substrate and between two MOS transistors, wherein the STI comprises a stress material, and the MOS transistors adjacent to two sides of the STI are transistors of the same conductivity type; and
    at least one conductive plug disposed on the substrate to connect the source/drain, wherein the stress plug surrounds and extends parallel to the gate structure, but not in direct contact with the gate structure, and the conductive plug is disposed between the gate structure and the stress plug.

2. The semiconductor device of claim 1, wherein the stress material is selected from a material consisting of silicon nitride, boron nitride, silicon oxide, silicon carbide, and silicon oxynitride.

3. The semiconductor device of claim 2, wherein the stress of silicon nitride is between −3.5 GPa to 2.0 GPa.

4. The semiconductor device of claim 2, wherein the stress of boron nitride is between −1 GPa to −2 GPa.

5. The semiconductor device of claim 1, wherein the MOS transistor further comprises:
    a spacer disposed around the gate structure.

6. The semiconductor device of claim 1, further comprising a stress layer disposed in the substrate and surface of the gate structure.

7. The semiconductor device of claim 5, wherein the gate structure comprises a metal gate or a polysilicon gate.

8. A semiconductor device, comprising:
    a substrate;
    at least two metal-oxide semiconductor (MOS) transistors disposed in the substrate, wherein the MOS transistor comprises a gate structure and a source/drain disposed in the substrate adjacent to two sides of the gate structure;
    a dielectric layer disposed on the substrate to cover the MOS transistor;
    at least one stress plug disposed in the dielectric layer and between two MOS transistors, wherein the stress plug comprises a stress material, and the MOS transistors adjacent to two sides of the stress plugs are transistors of the same conductivity type, the stress plug is not electrically connected to the source/drain of the MOS transistor, the top surface of the stress plug is substantially even to the top surface of dielectric layer and also higher than the MOS transistor; and
    at least one conductive plug disposed on the substrate to connect the source/drain, wherein the stress plug surrounds and extends parallel to a gate structure, but not in direct contact with the gate structure, and the conductive plug is disposed between the gate structure and the stress plug.

9. The semiconductor device of claim 8, wherein the stress material is selected from a material consisting of silicon nitride, boron nitride, silicon oxide, silicon carbide, and silicon oxynitride.

10. The semiconductor device of claim 9, wherein the stress of silicon nitride is between −3.5 GPa to 2.0 GPa.

11. The semiconductor device of claim 9, wherein the stress of boron nitride is between −1 GPa to −2 GPa.

12. The semiconductor device of claim 8, wherein the MOS transistor further comprises:
    a spacer disposed around the gate structure.

13. The semiconductor device of claim 12, further comprising a stress layer disposed in the substrate and surface of the gate structure.

14. The semiconductor device of claim 12, wherein the gate structure comprises a metal gate or a polysilicon gate.

15. A method for fabricating semiconductor device, comprising:
    providing a substrate;
    forming at least two metal-oxide semiconductor (MOS) transistors in the substrate, wherein the MOS transistor comprises a gate structure and a source/drain disposed in the substrate adjacent to two sides of the gate structure;
    forming a dielectric layer on the substrate to cover the MOS transistor;
    forming at least a contact hole in the dielectric layer and between two MOS transistors;
    filling the contact hole with a stress material to form at least one stress plug, wherein the MOS transistors adjacent to two sides of the stress plugs are transistors of the same conductivity type, and the stress plug is not electrically connected to the source/drain of the MOS transistor, the top surface of the stress plug is substantially even to the top surface of dielectric layer and also higher than the MOS transistor; and
    forming at least one conductive plug on the substrate to connect the source/drain, wherein the stress plug surrounds and extends parallel to a gate structure, but not in direct contact with the gate structure, and the conductive plug is disposed between the gate structure and the stress plug.

16. The method of claim 15, wherein the stress material is selected from a material consisting of silicon nitride, boron nitride, silicon oxide, silicon carbide, and silicon oxynitride.

17. The method of claim 16, wherein the stress of silicon nitride is between −3.5 GPa to 2.0 GPa.

18. The method of claim 16, wherein the stress of boron nitride is between −1 GPa to −2 GPa.

19. The method of claim 15, wherein the MOS transistor further comprises:
    a spacer disposed around the gate structure.

20. The method of claim 19, further comprising a stress layer disposed in the substrate and surface of the gate structure.

21. The method of claim 19, wherein the gate structure comprises a metal gate or a polysilicon gate.

* * * * *